United States Patent
Kim

(10) Patent No.: US 7,050,417 B2
(45) Date of Patent: May 23, 2006

(54) CHANNEL CODING/DECODING APPARATUS AND METHOD FOR A CDMA MOBILE COMMUNICATION SYSTEM

(75) Inventor: Jae-Yoel Kim, Kunpo-shi (KR)

(73) Assignee: Samsung Electronics Co., Ltd. (KR)

( * ) Notice: Subject to any disclaimer, the term of this patent is extended or adjusted under 35 U.S.C. 154(b) by 741 days.

(21) Appl. No.: 09/933,091

(22) Filed: Aug. 20, 2001

(65) Prior Publication Data
US 2002/0044542 A1   Apr. 18, 2002

(30) Foreign Application Priority Data
Aug. 18, 2000  (KR) ............... 2000-48726
Aug. 21, 2000  (KR) ............... 2000-48372

(51) Int. Cl.
*H04B 7/216* (2006.01)
(52) U.S. Cl. ..................... 370/342; 370/208
(58) Field of Classification Search ............ 370/328, 370/329, 335, 342, 441; 375/260, 261, 265; 714/786, 790
See application file for complete search history.

(56) References Cited

U.S. PATENT DOCUMENTS

| | | | | |
|---|---|---|---|---|
| 4,959,842 A | * | 9/1990 | Forney, Jr. ............... | 375/261 |
| 5,510,912 A | * | 4/1996 | Blaum et al. .............. | 359/21 |
| 5,727,226 A | * | 3/1998 | Blaum et al. .............. | 359/35 |
| 5,742,678 A | * | 4/1998 | Dent et al. ............... | 380/270 |
| 5,870,414 A | * | 2/1999 | Chaib et al. .............. | 714/792 |
| 5,926,488 A | * | 7/1999 | Khayrallah ................ | 714/752 |
| 6,240,143 B1 | * | 5/2001 | Shanbhag .................. | 375/295 |
| 6,373,859 B1 | * | 4/2002 | Jedwab et al. ............. | 370/479 |
| 6,426,978 B1 | * | 7/2002 | Bottomley et al. .......... | 375/265 |

FOREIGN PATENT DOCUMENTS

| | | |
|---|---|---|
| KR | 20000072240 | 12/2000 |
| WO | WO 02/19534 | 3/2002 |

OTHER PUBLICATIONS

"An Updated Table of Minimum-Distance Bounds For Binary Linear Codes", A.E. Brower and Verhoeff, IEEE Transactions on Information Theory, vol. 39, No. 2, Mar. 1993, pp. 662-677.

ETRI: "TCFI Repetition and Interleaving", TSG-RAN Working Group 1, Meeting #7, Aug. 30, 1999.

(Continued)

*Primary Examiner*—Bob A. Phunkulh
(74) *Attorney, Agent, or Firm*—Dilworth & Barrese, LLP

(57) ABSTRACT

Disclosed is a method for generating $(2^k-2^r)$ first order Reed-Muller codes from $2^k$ first order Reed-Muller codes based on k input information bits. The method comprises selecting t linearly independent $k^{th}$ order vectors; generating $2^t$ linear combinations by linearly combining the t selected vectors; calculating $2^t$ puncturing positions corresponding to the $2^t$ linear combinations; selecting one k×k matrix out of a plurality of k×k matrixes having k×k inverse matrixes; calculating $2^t$ new puncturing positions by multiplying each of the $2^t$ puncturing positions by the selecting k×k matrix; and generating $(2^k-2^r)$ first order Reed-Muller codes by puncturing the $2^t$ new puncturing positions from the $2^k$ first order Reed-Muller codes.

32 Claims, 5 Drawing Sheets

OTHER PUBLICATIONS

ETRI: "Simulation Results of TCFI Repetition and its text proposal", TSG-RAN Working Group 1, Meeting #8, Oct. 12, 1999.

Wilson, "Linear Block Codes", Digital Modulation and Coding, 1996.

McWilliams et al., "Theory of error-correcting codes passage", Theory of error Correcting Codes, 1997.

Samsung: "Harmonization impact on TFCI and new optimal coding fro Extended TRCI with almost no complexity increase (rev 1)", TSG-RAN Working Group 1, Meeting #6, Jul. 13, 1999.

Samsung: "Text proposal reguarding TFCI coding for FDD", TSG-RAN Working Group 1, Meeting #7, Aug. 30, 1999.

Samsung: "TFCI Coding Scheme for 8PSK in low chip rate TDD Option", TSG-RAn Working Group 1, Meeting #15, Aug. 22, 2005.

* cited by examiner

CHANNEL CODING/DECODING APPARATUS AND METHOD FOR A CDMA MOBILE COMMUNICATION SYSTEM

PRIORITY

This application claims priority to an application entitled "Channel Coding/Decoding Apparatus and Method for a CDMA Mobile Communication System" filed in the Korean Industrial Property Office on Aug. 18, 2000 and assigned Serial No. 2000-48726, and an application entitled "Channel Coding/Decoding Apparatus and Method for a CDMA Mobile Communication System" filed in the Korean Industrial Property Office on Aug. 21, 2000 and assigned Serial No. 2000-48732, the contents of both of which are hereby incorporated by reference.

BACKGROUND OF THE INVENTION

1. Field of the Invention

The present invention relates generally to a code generator for a CDMA mobile communication system, and in particular, to a TFCI (Transport Format Combination Indicator) code generator and a method for embodying the same.

2. Description of the Related Art

An IMT2000 system, a future CDMA mobile communication system, transmits various service frames for supporting a voice service, an image service, and a data service within one physical channel. The service frames are transmitted at either a fixed data rate or a variable data rate. The different services transmitted at the fixed data rate are not required to separately notify a spreading rate to a receiver. However, the services transmitted at the variable data rate must inform the receiver of the spreading rates of the respective service frames, since the data rate may be changed during the services. The spreading rate is determined depending on the data rate.

In the IMT-2000 system, the data rate is in inverse proportion to the data-spreading rate. When the frames used by the respective services have different data rates, a TFCI (Transport Formation Combination Indicator) bit is used to indicate a combination of the currently transmitted services. The TFCI enables correct reception of the services.

FIG. 1 illustrates a method of using the TFCI in an NB-TDD (Narrow Band-Time Division Duplex) system, by way of example. In particular, the NB-TDD system uses 8PSK (8-ary Phase Shift Keying) modulation for high-speed data transmission, and codes the TFCI value with a length=24 code before transmission.

Referring to FIG. 1, one frame is comprised of two subframes. The subframes each include 7 time slots TS#0–TS#6, a downlink pilot time slot DwPTS, a guard period where no signal is transmitted, and an uplink pilot time slot UpPTS. The 7 time slots TS#0–TS#6 are divided into downlink time slots TS#0, TS#4, TS#6, and uplink time slots TS#1, TS#2 and TS#3. Each time slot comprises data fields for storing data symbols, two TFCI fields for storing TFCIs associated with the data symbols stored in the data fields, a field for storing a midamble, a field for storing SS symbols, and a field for storing TPC (Transmission Power Control) symbols. A time length of the frame is $T_f=10$ ms, and a time length of the subframe is $T_{sf}=5$ ms. In addition, a time length of each time slot is $T_{slot}=0.625$ ms.

FIG. 2 illustrates a structure of a transmitter in the conventional NB-TDD CDMA mobile communication system. Referring to FIG. 2, a TFCI encoder 200 encodes input TFCI bits at a given coding rate and generates coded TFCI symbols. The coded TFCI symbols are provided to a first multiplexer (MUX) 210 as one input. At the same time, other signals comprised of the data symbols, the SS symbols and the TPC symbols included in one slot of FIG. 1 are provided to the first multiplexer 210 as another input. The coded TFCI symbols, the data symbols, the SS symbols, and the TPC symbols are multiplexed by the first multiplexer 210. The multiplexed signals are then channel-spread with an orthogonal code by a channel spreader 220. The channel-spread signals are scrambled with a scrambling code by a scrambler 230, and then provided to a second multiplexer 240 as one input. At the same time, a midamble signal is provided to the second multiplexer 240 as another input, and multiplexer with the scrambled signals. As a result, the second multiplexer 240 outputs a signal having the slot format shown in FIG. 1. The first and second multiplexers 210 and 240 output the fame format of FIG. 1, under the control of a controller (not shown).

FIG. 3 illustrates a structure of a conventional NB-TDD receiver corresponding to the above-described transmitter. Referring to FIG. 3, a signal received from the transmitter is demultiplexed by a first demultiplexer (DEMUX) 340, so that a midamble signal is separated from the received signal. The midamble-removed signal is descrambled by a descrambler 330 with the scrambling code used by the transmitter. The descrambled signal is channel-despread by a channel despreader 320 with the orthogonal code used by the transmitter. The despread signal is demultiplexed (separated) into coded TFCI symbols and other signals by a second demultiplexer 310. The "other signals" refers to the data symbols, the SS symbols and the TPC symbols. The separated coded TFCI symbols are decoded into TFCI bits by a TFCI decoder 300.

The TFCI bits indicate 2 to 4 combinations expressed with 1 to 2 bits according to combination of transmission information, and default TFCI bits indicate 8 to 32 combination expressed with 3 to 5 bits. In addition, extended TFCI bits indicate 64 to 1024 combinations expressed with 6 to 10 bits. The TFCI bits are required information when the receiver analyzes transmission information of the received frames. Therefore, if a transmission error occurs in the TFCI bits, the receiver may not correctly receive the respective service frames. For this reason, the TFCI bits are encoded at the receiver using a high-efficiency error correcting code capable of correcting a possible transmission error.

FIG. 4 illustrates an error correction encoding scheme for a 5-bit default TFCI. In particular, FIG. 4 illustrates a structure of a (24,5) encoder by way of example. That is, the drawing shows a scheme for outputting a 24-symbol coded TFCI by encoding a 5-bit default TFCI.

Referring to FIG. 4, a (16,5) bi-orthogonal code encoder 400 encodes 5-bit TFCI input information into a 16-symbol coded TFCI, and provides the 16-symbol coded TFCI to a repeater 410. The repeater 410 outputs the intact even-numbered symbols out of the provided coded TFCI symbols, and repeats the odd-numbered symbols, thus outputting a total of 24 coded TFCI symbols. Herein, the scheme has been described with reference to the 5-bit input TFCI. However, when the input TFCI is comprised of less than 5 bits, a zero (0) bit(s) is added at the head of the input TFCI to make a TFCI having a length of 5 bits.

An intercode minimum distance of the (16,5) bi-orthogonal encoder 400 is 8. In addition, even the (24,5) code output from the repeater 410 also has the minimum distance of 8. In general, an error correcting capability of binary linear codes depends on the intercode minimum distance of the binary linear codes. A reference, *An Updated Table of*

*Minimum-Distance Bounds for Binary Linear codes* (A. E. Brouwer and Tom Verhoeff, IEEE Transactions on information Theory; VOL 39, NO. 2, MARCH 1993), discloses an intercode minimum distance which depends on the input and output values of the binary linear codes to be optimal codes depending on the number of coded symbols generated encoding input information bits.

Taking into consideration the fact that the TFCI transmitted in FIG. 4 is comprised of 5 bits and the coded TFCI is comprised of 24 symbols, the intercode minimum distance required in the above-stated reference is 12. However, since the minimum distance between the coded symbols output from the encoder shown in FIG. 4 is 8, the encoder does not have the optimal codes. If the error correction encoding scheme of FIG. 4 fails to have the optimal codes, an error rate of the TFCI bits increases in the same channel environment. As a result, the receiver may erroneously recognize a data rate of the data frames, increasing frame error rate (FER). Therefore, there is a demand for an error correction encoding scheme capable of obtaining optimal codes through encoding of the TFCI bits.

SUMMARY OF THE INVENTION

It is, therefore, an object of the present invention to provide an apparatus and method for creating optimal codes in a CDMA mobile communication system using TFCI bits.

It is another object of the present invention to provide an apparatus and method for determining optimal puncturing positions for puncturing first order Reed-Muller codes to create optimal codes.

It is further another object of the present invention to provide an apparatus and method for determining optimal puncturing positions to obtain first order Reed-Muller codes having high error correcting capability.

It is yet another object of the present invention to provide an apparatus and method for puncturing coded input information bits in the optimal puncturing positions.

It is still another object of the present invention to provide an apparatus and method for encoding input information bits with first order Reed-Muller codes punctured in optimal puncturing positions.

It is still another object of the present invention to provide an apparatus and method for outputting a punctured coded symbol stream selected by input information bits.

It is still another object of the present invention to provide an apparatus and method for decoding input information bits encoded with first order Reed-Muller codes using optimal puncturing positions used by a transmitter.

It is still another object of the present invention to provide an apparatus and method for decoding input information bits encoded with first order Reed-Muller codes punctured in optimal puncturing positions.

According to one aspect of the present invention, there is provided a method for generating $(2^k-2^t)$ first order Reed-Muller codes from $2^k$ first order Reed-Muller codes based on k input information bits. The method comprises the steps of selecting t linearly independent $k^{th}$ order vectors; generating $2^t$ linear combinations by linearly combining the t selected vectors; calculating $2^t$ puncturing positions corresponding to the $2^t$ linear combinations; selecting one k×k matrix out of a plurality of k×k matrixes having k×k inverse matrixes; calculating $2^t$ new puncturing positions by multiplying each of the $2^t$ puncturing positions by the selected k×k matrix; and generating $(2^k-2^t)$ first order Reed-Muller codes by puncturing the $2^t$ new puncturing positions from the $2^k$ first order Reed-Muller codes.

According to another aspect of the present invention, there is provided a method for receiving $(2^k-2^t)$ coded symbols from a transmitter and decoding k information bits from the $(2^k-2^t)$ received coded symbols. The method comprises the steps of selecting t linearly independent $k^{th}$ order vectors, and calculating positions corresponding to $2^t$ linear combinations obtained by combining the t selected vectors; outputting $2^k$ coded symbols by inserting zero (0) bits in the calculated positions of the $(2^k-2^t)$ coded symbols; calculating reliabilities of respective first order Reed-Muller codes comprised of the $2^k$ coded symbols and $2^k$ bits used by the transmitter; and decoding the k information bits from the $2^k$ coded symbols with a first order Reed-Muller code having the highest reliability.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
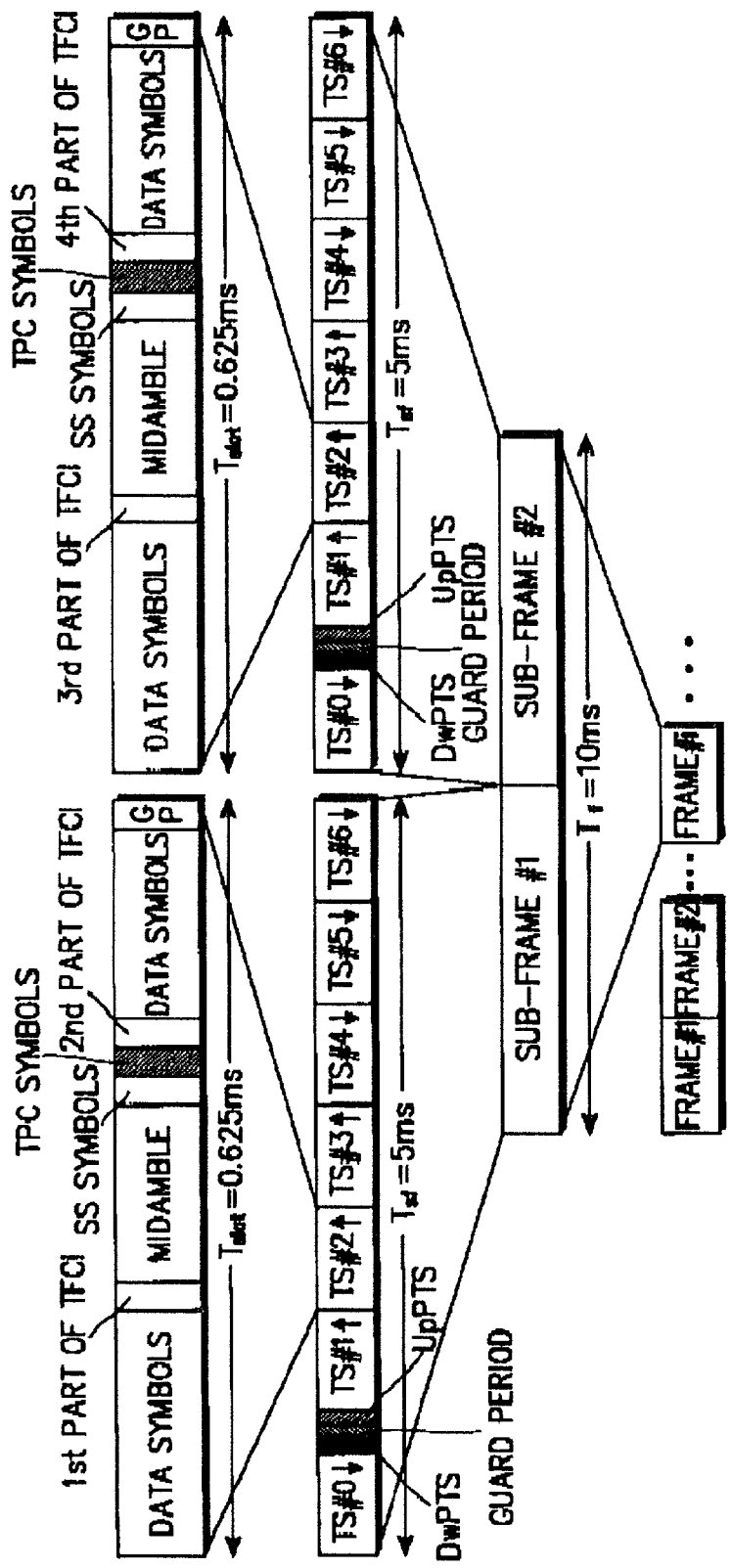
FIG. 1 is a diagram illustrating a frame format in a conventional NB-TDD CDMA mobile communication system.
Figure 2:
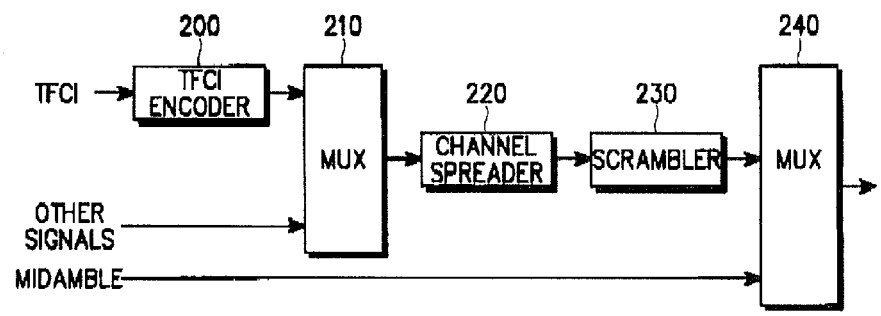
FIG. 2 is a diagram illustrating a structure of a transmitter in the conventional NB-TDD CDMA mobile communication system.
Figure 3:
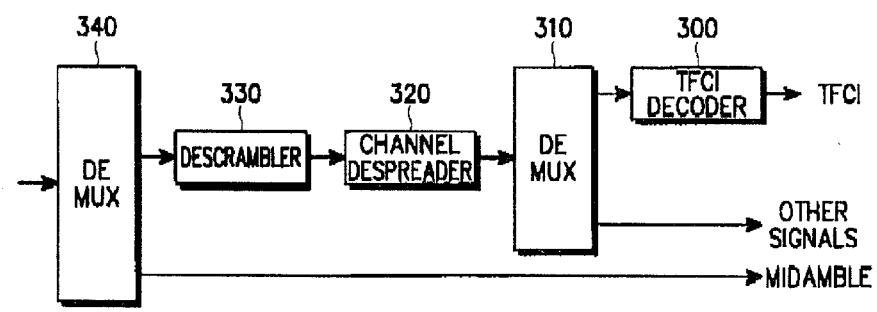
FIG. 3 is a diagram illustrating a structure of a receiver corresponding to the transmitter shown in FIG. 2.
Figure 4:
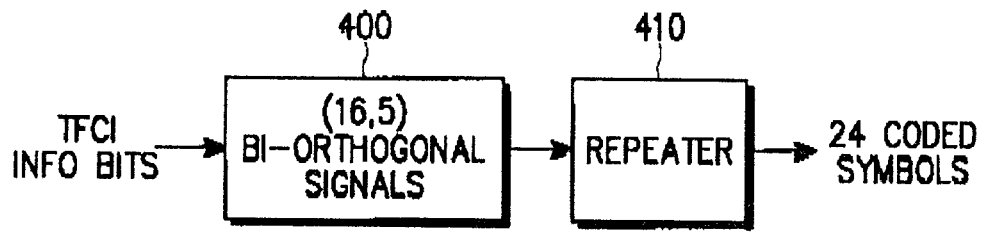
FIG. 4 is a diagram illustrating a structure of a conventional (24,5) TFCI encoder.

A preferred embodiment of the present invention will be described herein below with reference to the accompanying drawings. In the following description, well-known functions or constructions are not described in detail since they would obscure the invention in unnecessary detail.

The present invention relates to a method for encoding TFCI bits so that the CDMA mobile communication system using the TFCI bits creates optimal codes. For example, the present invention applies punctured (24,5) first order Reed-Muller codes obtained by puncturing 8 symbols out of the coded symbols output by first order Reed-Muller codes of length 32 to the CDMA mobile communication system. That is, the punctured (24,5) first order Reed-Muller codes are 24 coded symbols obtained by punctured 8 symbols out of the 32 coded symbols output by the punctured first order Reed-Muller codes of length 32.

A change in the puncturing positions of the 8 symbols may vary a minimum distance $d_{min}$ of the punctured (24,5) first order Reed-Muller codes. The minimum distance refers to the minimum value out of Hamming distance values of several codewords. As the minimum distances increases more and more, the linear error correcting codes have improved error correcting capability. That is, Hamming distance distributed for codewords of the error correcting codes can serve as a measure indicating the capability of the error correcting codes. This means the number of non-zero symbols in the respective codewords. That is, for a certain codeword '0111', the number of 1's, i.e., the Hamming distance is 3. An increase in the minimum distance corresponding to the minimum value out of such Hamming distance values improves the error correcting capability of puncturing positions in order to create the punctured (24,5) first order Reed-Muller codes having superior error correcting capability in the punctured first order Reed-Muller codes of length 32.

Actually, the (24,5) first order Reed-Nuller codes are obtained by puncturing $2^3$ (=8) symbols from the (32,5) first order Reed-Muller codes. This is an example generalized by applying k=5 and t=3 to $(2^k-2^t,k)$ first order Reed-Muller codes obtained by puncturing $2^t$ bits from the $(2^k,k)$ first order Reed-Muller codes. An encoder generating the $(2^k-2^t,k)$ first order Reed-Muller codes has a minimum distance of $2^{k-1}-2^{t-1}$.

Therefore, the present invention discloses a method for calculating $2^t$ puncturing positions for optimizing the $(2^k-2^t,k)$ first order Reed-Muller codes created by puncturing $2^t$ bits from the $(2^k,k)$ first order Reed-Muller codes. In the following description, the $(2^k-2^t,k)$ first order Reed-Muller codes will be referred to as "$(2^k-2^t,k)$ codes" for short.

Before describing the method for calculating the optimal puncturing positions, a mathematical term, which becomes a background of the invention, will be defined. A linear independent property for a vector space V having a $k^{th}$ order vector v $(=v^{k-1}, \ldots, v^1, v^0)$ as its elements is defined by Equation (1).

$$v^0, v^1, \ldots, v^{t-1}: \text{linear independent property} \Leftrightarrow c_{t-1}v^{t-1}+\ldots+c_1v^1+c_0v^0 \neq 0, \forall c_0, c_1, \ldots, c_{t-1} \quad (1)$$

Figure 5:
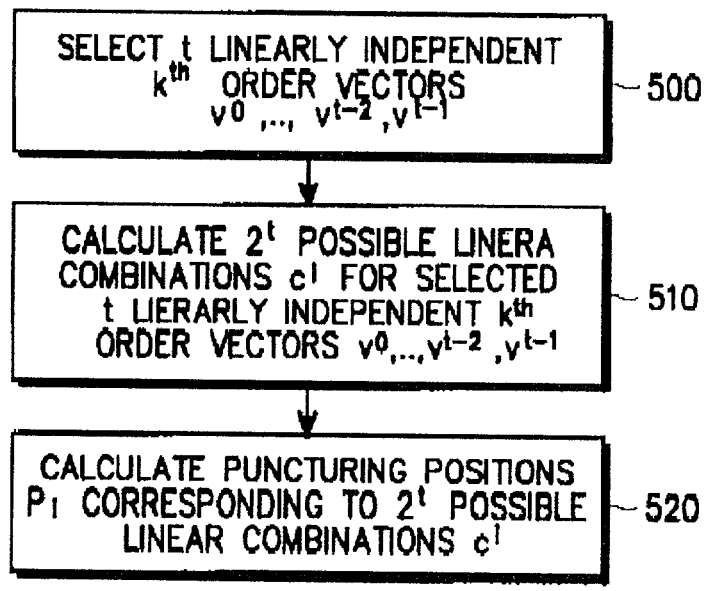
FIG. 5 is a flow chart illustrating a procedure for calculating optimal puncturing positions according to an embodiment of the present invention.

FIG. 5 illustrates a procedure for calculating optimal puncturing positions in a CDMA mobile communication system according to an embodiment of the present invention. Referring to FIG. 5, t linearly independent $k^{th}$ order vectors $v^0, v^1, \ldots, v^{t-1}$ are selected by Equation (1) in step 500. After the t $k^{th}$ order vectors are selected, possible linear combinations $c^i$ for the selected t $k^{th}$ order vectors $v^0, v^1, \ldots, v^{t-1}$ are calculated by Equation (2) in step 510.

$$c^i=(c_{k-1}^i, \ldots, c_1^i, c_0^i) \quad (2)$$

where i indicates an index for the number of the linear combinations, and k indicates the order of the vector, or indicates the number of vector coordinates.

The total number of the possible liner combinations, which can be calculated by Equation (2), becomes $2^t$.

Thereafter, in step 520, puncturing positions $p_i$ for the calculated $2^t$ possible linear combinations are calculated by Equation (3).

$$P_i = \sum_{j=0}^{k-1} c_j^i 2^t \quad t=1, \ldots, 2^t \quad (3)$$

Equation (3) serves to convert the respective $2^t$ linear combinations $c^i$ to decimal numbers.

For better understanding of the above-stated procedure, a method for calculating the puncturing position of the (24,5) codes, which are k=5, t=3 $(2^k-2^t,k)$ codes, will be described herein below.

First, in step 500, 3 linearly independent $5^{th}$ order vectors $v^0=(0,0,0,0,1)$ $v^1=(0,0,0,1,0)$ and $v^2$ $(0,0,1,0,0)$ are selected. Next, all the possible linear combinations $c^i$ for the selected three $5^{th}$ order vectors $v^0, v^1$ and $V^2$ are calculated by Equation (2) in step 510. The possible linear combinations $c^i$ calculated by Equation (2) are given as follows:

$c^1=(0,0,0,0,0)$, $c^2=v^0=(0,0,0,0,1)$, $c^3=v^1=(0,0,0,1,1)$, $c^4=v^1+v^0=(0,0,0,1,1)$, $c^5=v^2=(0,0,1,0,0)$, $c^6=v^2+v^0=(0,0,1,0,1)$, $c^7=v^2+v^1=(0,0,1,1,0)$, $c^8=v^2+v^1+v^0=(0,0,0,0,1)$

After all the possible linear combinations are calculated in step 510, the puncturing positions $p_i$ for the calculated possible $2^3=8$ linear combinations are calculated by Equation (3) in step 520. The puncturing positions calculated by Equation (3) are given as follows:

$p_1=0\cdot2^4+0\cdot2^3+0\cdot2^2+0\cdot2^1+0\cdot2^0=0$, $p_2=0\cdot2^4+0\cdot2^3+0\cdot2^2+0\cdot2^1+1\cdot2^0=1$, $p_3=0\cdot2^4+0\cdot2^3+0\cdot2^2+1\cdot2^1+0\cdot2^0=2$, $p_4=0\cdot2^4+0\cdot2^3+0\cdot2^2+1\cdot2^1+1\cdot2^0=3$, $p_5=0\cdot2^4+0\cdot2^3+1\cdot2^2+0\cdot2^1+0\cdot2^0=4$, $p_6=0\cdot2^4+0\cdot2^3+1\cdot2^2+0\cdot2^1+1\cdot2^0=5$, $p_7=0\cdot2^4+0\cdot2^3+1\cdot2^2+1\cdot2^1+0\cdot2^0=6$, $p_8=0\cdot2^4+0\cdot2^3+1\cdot2^2+1\cdot2^1+1\cdot2^0=7$ Therefore, for k=5 and t=3, it is possible to obtain optimal (24,5) codes by puncturing $0^{th}, 1^{st}, 2^{nd}, 3^{rd}, 4^{th}, 5^{th}, 6^{th}$ and $7^{th}$ symbols of the (32,5) first order Reed-Muller codes.

Actually, there exist many other puncturing positions in addition to the puncturing positions of the (32,5) first order Reed-Muller codes for calculating the optimal (24,5) codes. The other puncturing positions excepting the above-stated puncturing positions can be calculated using the linear combination $c^i$. That is, the other optimal puncturing positions can be calculated by performing step 520 of FIG. 5 on vectors $c^i$ determined by multiplying a k×k invertible matrix A by the linear combination $c^i$. The result is $$\prod_{j=0}^{k-1}(2^k-2^j)$$

k×k invertible matrixes.

it is possible to easily calculate the number of k×k invertible matrixes from a method for creating matrixes having inverse matrixes. In the method for calculating the k×k invertible matrixes, for a first column, $k^{th}$ order column vectors, which are non-zero vectors, are selected and arranged, and the number of such cases is $2^k-2^0$. For a second column, the column vectors, which are not zero vectors nor the column vectors used for the first column, are selected and arranged, and the number of such cases is $2^k-2^1$. For a third column, the column vectors, which are not the column vectors determined by the linear combinations of the column vectors for the first and second columns, are selected and arranged, and the number of such cases is $2^k-2^1$. In this method, for an $i^{th}$ column, the column vectors which are not the column vectors determined by the linear combinations of the (i−1) column vectors used for the first to $(i-1)^{th}$ columns, are selected and arranged, and the number of such cases is $2^k-2^i-1$. It is possible to easily calculate the invertible matrixes by selecting and arranging the column vectors in this matter. The number of all the invertible matrixes is $$\prod_{j=0}^{k-1}(2^k - 2^j).$$

For example, the above-stated example will be described with reference to a 5×5 invertible matrix A shown in Equation (4).

$$\begin{bmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{bmatrix} \quad (4)$$

The vectors $c'^i$ calculated by multiplying the k×k invertible matrix A by linear combinations $c^{iT}$ are given as follows:

$c'^1 = A \cdot c^{1T} = (0,0,0,0,0)^T,$ $c'^2 = A \cdot c^{2T} = (0,0,1,0,0)^T,$ $c'^3 = A \cdot c^{3T} = (0,1,0,0,0)^T,$ $c'^4 = A \cdot c^{4T} = (0,1,1,0,0)^T,$ $c'^5 = A \cdot c^{5T} = (1,0,0,0,0)^T,$ $c'^6 = A \cdot c^{6T} = (1,0,1,0,0)^T,$ $c'^7 = A \cdot c^{7T} = (1,1,0,0,0)^T,$ $c'^8 = A \cdot c^{8T} = (1,1,1,0,0)^T$ In the above process, T indicates transpose, and the row vectors $c^{iT}$ are transposed into column vectors and then multiplied by the matrix A.

After all the possible combinations stated above are calculated, the puncturing positions $p_i$ for the calculated vectors $c'^{iT}$ are calculated using Equations (3) in step 520. The puncturing positions calculated by Equation (3) are as follows:

$p_1 = 0 \cdot 2^4 + 0 \cdot 2^3 + 0 \cdot 2^2 + 0 \cdot 2^1 + 0 \cdot 2^0 = 0,$ $p_2 = 0 \cdot 2^4 + 0 \cdot 2^3 + 1 \cdot 2^2 + 0 \cdot 2^1 + 0 \cdot 2^0 = 4,$ $p_3 = 0 \cdot 2^4 + 1 \cdot 2^3 + 0 \cdot 2^2 + 0 \cdot 2^1 + 0 \cdot 2^0 = 8,$ $p_4 = 0 \cdot 2^4 + 1 \cdot 2^3 + 1 \cdot 2^2 + 1 \cdot 2^1 + 0 \cdot 2^0 = 12,$ $p_5 = 1 \cdot 2^4 + 0 \cdot 2^3 + 0 \cdot 2^2 + 0 \cdot 2^1 + 0 \cdot 2^0 = 16,$ $p_6 = 1 \cdot 2^4 + 0 \cdot 2^3 + 1 \cdot 2^2 + 0 \cdot 2^1 + 0 \cdot 2^0 = 20,$ $p_7 = 1 \cdot 2^4 + 1 \cdot 2^3 + 0 \cdot 2^2 + 0 \cdot 2^1 + 0 \cdot 2^0 = 24,$ $p_8 = 1 \cdot 2^4 + 1 \cdot 2^3 + 1 \cdot 2^2 + 0 \cdot 2^1 + 0 \cdot 2^0 = 28$ Therefore, for k=5 and t=3, it is possible to obtain the optimal (24,5) codes by puncturing the other optimal puncturing positions $0^{th}$, $4^{th}$, $8^{th}$, $12^{th}$, $16^{th}$, $20^{th}$, $24^{th}$ and $28^{th}$ from the (32,5) first order Reed-Muller codes.

Next, a description of the invention will be made with reference to embodiments where the above-provided $(2^k-2^t,k)$ codes are used and in particular, the (24,5) codes using the two types of the above-calculated puncturing positions are used.

First Embodiment

Figure 6:
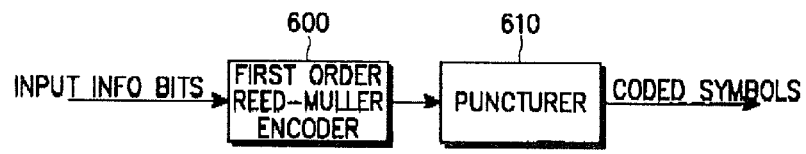
FIG. 6 is a diagram illustrating a structure of an encoder included in a transmitter according to an embodiment of the present invention.

The first embodiment of the present invention provides an encoding apparatus and method for a transmitter based on the above-stated optimal code generation method. FIG. 6 illustrates a structure of an encoder included in a transmitter for a CDMA mobile communication system according to an embodiment of the present invention.

Referring to FIG. 6, a (32,5) first order Reed-Muller encoder 600 encodes 5 input information bits of a0, a1, a2, a3 and a4, and outputs a coded symbol stream comprised of 32 coded symbols.

Figure 8:
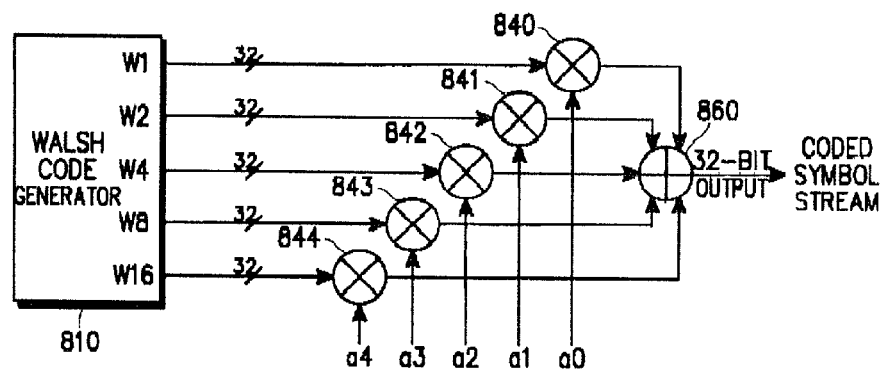
FIG. 8 is a diagram illustrating a detailed structure of the encoder according to an embodiment of the present invention.

FIG. 8 illustrates a detailed structure of the first order Reed-Muller encoder 600. Referring to FIG. 8, the 5 input information bits a0, a1, a2, a3 and a4 are provided to their associated multipliers 840, 841, 842, 843 and 844, respectively. At the same time, a Walsh code generator 810 generates Walsh codes W1, W2, W4, W8 and W16, and provides the generated Walsh codes W1, W2, W4, W8 and W16 to the associated multipliers 840, 841, 842, 843 and 844, respectively.

More specifically, the Walsh code W1=01010101010101010101010101010101 is provided to the first multiplier 840, and the Walsh code W2=00110011001100110011001100110011 is provided to the second multiplier 841. Further, the Walsh code W4=Walsh code W8=00000000111111110000000011111111 is provided to the forth multiplier 843, and the Walsh code W16=00000000000000001111111111111111 is provided to the fifth multiplier 844.

The first multiplier 840 multiplies the input information bit a0 by the Walsh code W1 in a bit unit and outputs 32 coded symbols. That is, the first multiplier 840 encodes the information bit a0 with the Walsh code W1 of length 32 and outputs a coded symbol stream comprised of 32 coded symbols. This same process is repeated with the remaining information bits (a1–a4) and Walsh Codes (W2, W4, W8 and W16) by the respective multipliers 841–844.

The five coded symbol streams output from the first to fifth multipliers 840, 841, 842, 843 and 844 are provided to a summer 860. The summer 860 sums up the five coded symbol streams output from the first to fifth multipliers 840, 841, 842, 843 and 844 in a symbol unit, and outputs one coded symbol stream of length 32.

In the first embodiment, the first order Reed-Muller encoder 600 encodes the 5 input information bits with different Walsh codes, sums up the encoded information bits, and outputs one coded symbol stream of length 32. However, as another example, it is also possible to embody a method for outputting a coded symbol, stream of length 32, which corresponds to the 5 input information bits. That is, the first order Reed-Muller encoder 600 includes a memory table for storing different coded symbol streams of length 32 corresponding to the 5 respective input information bits, and reads out the coded symbol stream corresponding to the 5 input information symbols.

The coded symbol stream output from the first order Reed-Muller encoder 600 is provided to a puncturer 610. The puncturer 610 punctures the symbols in the 8 puncturing positions determined by the proposed method out of the 32 symbols constituting the provided coded symbol stream. For example, if the optimal puncturing positions are determined as $0^{th}$, $1^{st}$, $2^{nd}$, $3^{rd}$, $4^{th}$, $5^{th}$, $6^{th}$ and $7^{th}$ symbols, the puncturer 610 punctures the $0^{th}$, $1^{st}$, $2^{nd}$, $3^{rd}$, $4^{th}$, $5^{th}$, $6^{th}$ and $7^{th}$ symbols out of the coded symbols. Therefore, the puncturer 610 outputs a coded symbol stream comprised of 24 symbols, which do not correspond to the puncturing positions.

Figure 7:
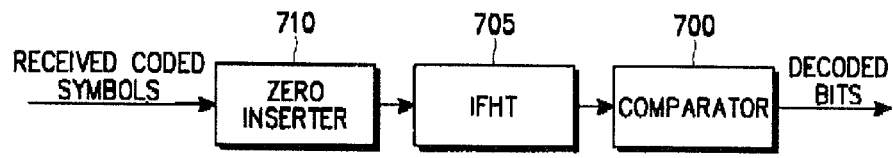
FIG. 7 is a diagram illustrating a structure of a decoder included in a receiver according to an embodiment of the present invention.

FIG. 7 illustrates a structure of an encoder included in a receiver for a CDMA mobile communication system according to an embodiment of the present invention. Referring to FIG. 7, a zero inserter 710 receives a coded symbol, stream of length 24 from the transmitter, and inserts zero (0) bits in the puncturing positions used by the, puncturer 610 shown in FIG. 6. That is, when the puncturer 610 has punctured the $0^{th}$, $1^{st}$, $2^{nd}$, $3^{rd}$, $4^{th}$, $5^{th}$, $6^{th}$ and $7^{th}$ coded symbols, the zero inserter 710 inserts the zero bits in the first 8 puncturing positions of the coded symbol stream of length 24, and thus outputs a coded symbol stream of length 32. To this end, the zero inserter 710 must be acquainted with zero insertion positions, i.e., the Puncturing positions used by the puncturer 610. This information is provided from the transmitter in a given process. The coded symbol stream of length 32 output from the zero inserter 710 is provided to an inverse fast Hadamard transform part (IFHT) 705. The IFHT 705 compares the provided coded symbol stream of length 32, with all the first order Reed-Muller codewords of length 32, and calculates reliabilities of the respective first order Reed-Muller codewords based on the comparison results. The first order Reed-Muller codewords may be the Walsh codes used for encoding by the transmitter, and the reliabilities can be obtained by calculating correlations between the coded symbol stream and the Walsh codes. In addition, the IFHT 705 decodes the coded symbol stream of length 32 with all the first order Reed-Muller codewords. The IFHT 705 outputs the calculated reliabilities and the input information bits decoded by the respective first order Reed-Muller codewords. The reliabilities and the decoded information bits make pairs, the number of which is equal to the number of the first order Reed-Muller codewords. The pairs of the reliabilities and the input information bits are provided to a comparator 700. The comparator 700 selects the highest reliability out of the provided reliabilities, and outputs the input information bit pairing with the selected reliability as a decoded bit.

The embodiment has determined the $0^{th}$, $1^{st}$, $2^{nd}$, $3^{rd}$, $4^{th}$, $5^{th}$, $6^{th}$, and $7^{th}$ symbols as the optimal puncturing positions, by way of example. However, as mentioned above, the $0^{th}$, $4^{th}$, $8^{th}$, $12^{th}$, $16^{th}$, $20^{th}$ and $28^{th}$ symbols may also be used as the optimal puncturing positions. In this case, the zero insertion positions of the zero inserter 710 are also changed according to the puncturing positions.

In addition, since the puncturing positions according to the embodiment are so determined as to optimize the capability of the encoder and have simple regularity, it is possible to reduce hardware complexity of the encoder in the transmitter and the decoder in the receiver.

Second Embodiment

Although the first embodiment has proposed a scheme for puncturing the coded symbol stream, the second embodiment proposes a scheme for puncturing the Walsh codes used for encoding before encoding the input information bits. That is, the second embodiment provides an apparatus and method for performing the puncturing and encoding operations at the same time, Without the separate puncturer.

Figure 9:
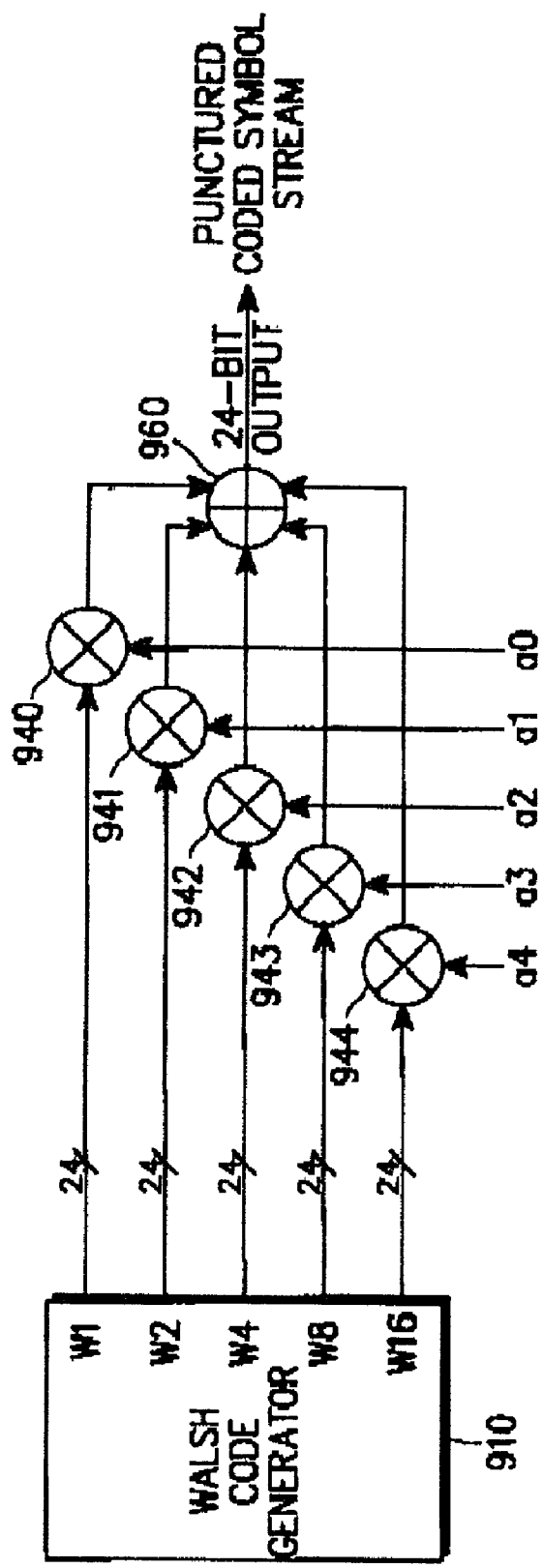
FIG. 9 is a diagram illustrating a detailed structure of the encoder according to another embodiment of the present invention.

FIG. 9 illustrates a detailed structure of the encoder according to the second embodiment of the present invention. Referring to FIG. 9, five input information bits a0, a1, a2, a3 and a4 are provided to first to fifth multipliers 940, 941, 942, 943 and 944, respectively. At the same time, a Walsh code generator 910 generates 8-bit-punctured Walsh codes W1, W2, W4, W8 and W16 of length 24. The Walsh codes of length 24 output from the Walsh code generator 910 correspond to the Walsh codes of length 32 used in the first embodiment, from which 8 bits corresponding to the optimal puncturing positions are punctured. That is, as stated above, the optimal puncturing positions correspond to the $0^{th}$, $1^{st}$, $2^{nd}$, $3^{rd}$, $4^{th}$, $5^{th}$, $6^{th}$ and $7^{th}$ bits, or $0^{th}$, $4^{th}$, $8^{th}$, $12^{th}$, $16^{th}$, $20^{th}$, $24^{th}$, and $28^{th}$ bits. In the following description, the optimal puncturing positions will be assumed to be the $0^{th}$, $1^{st}$, $2^{nd}$, $3^{rd}$, $4^{th}$, $5^{th}$, $6^{th}$ and $7^{th}$ bits.

The punctured Walsh codes W1, W2, W4, W8 and W16 output from the Walsh code generator 910 are provided to the first to fifth multipliers 940, 941, 942, 943 and 944, respectively. More specifically, the Walsh code W1=010101010101010101010101 is provided to the first multiplier 940, and the Walsh code W2=001100110011001100110011 is provided to the second multiplier 941. Further, the Walsh code W4=000011110000111100001111 is provided to the third multiplier 942, the Walsh code W8=111111110000000011111111 is provided to the fourth multiplier 943, and the Walsh code W16=000000001111111111111111 is provided to the fifth multiplier 944.

The first multiplier 940 multiplies the input information bit a0 by the punctured Walsh code W1 in a bit unit. That is, the first multiplier 940 encodes the information bit a0 with the punctured Walsh code W1 of length 24 and outputs a coded symbol stream comprised of 24 coded symbols. This same process is repeated with the remaining information bits (a1–a4) and Walsh Codes (W2, W4, W8 and W16) by the respective multipliers 941–944.

The five coded symbol streams output from the first to fifth multipliers 940, 941, 942, 943 and 944 are provided to a summer 960. The summer 960 sums up the five coded symbol streams output from the first to fifth multipliers 940, 941, 942, 943 and 944 in a symbol unit, and outputs one coded symbol stream of length 24.

In FIG. 9, the Walsh code generator 910 outputs the 24-bit Walsh codes obtained by puncturing 8 bits corresponding to the optimal puncturing positions out of the 32-bit Walsh codes. However, in an alternative embodiment, it is also possible to arrange a puncturer at a following stage of the Walsh code generator 910, so that the puncturer punctures the 32-Walsh codes from the Walsh code generator 910. Further, in the embodiments, the first order Reed-Muller encoder 600 encodes the 5 input information bits with the different Walsh codes, sums up the encoder information bits, and outputs one coded symbol stream of length 24. However, in an alternative embodiment, it is also possible to embody a method for outputting a coded symbol stream of length 24, which corresponds to the 5 input information bits. That is, the first order Reed-Muller encoder 600 includes a memory table for storing different coded symbol streams of length 24 corresponding to the 5 respective input information bits, and reads out the coded symbol stream corresponding to the 5 input information symbols.

As described above, the NB-TDD CDMA mobile communication system according to present invention optimally encodes and decodes the transport format combination indicator (TFCI) bits to obtain the optimal minimum distance, thereby increasing the error correcting capability. In addition, it is possible to simplify the encoding and decoding schemes by determining the puncturing positions according to the simple regularity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for generating ($2^k-2^t$) first order Reed-Muller codes from $2^k$ first order Reed-Muller codes based on k input information bits, for encoding said k input information bits in an encoder, comprising the steps of:
   selecting t linearly independent $k^{th}$ order vectors;
   generating $2^t$ linear combinations by linearly combining the t selected vectors;
   calculating $2^t$ puncturing positions corresponding to the $2^t$ linear combinations;
   generating ($2^k-2^t$) first order Reed-Muller codes by puncturing the $2^t$ puncturing positions from the $2^k$ first order Reed-Muller codes; and
   encoding said k input information bits using said ($2^k-2^t$) first order Reed-Muller codes.

2. The method as claimed in claim 1, wherein the linearly independent $k^{th}$ order vectors satisfy a linear independent property represented by, $$v^0, v^1, \ldots, v^{t-1}: \text{linear independent property} \Leftrightarrow$$
$$c_{t-1}v^{t-1}+\ldots+c_1v^1+c_0v^0 \neq 0, \forall c_0, c_1, \ldots, c_{t-1}.$$

3. The method as claimed in claim 1, wherein the $2^t$ linear combinations are, $$c^i=(c_{k-1}^i, \ldots, c_1^i, c_0^i)$$

where i indicates an index for the number of the linear combinations.

4. The method as claimed in claim 1, wherein the 2 puncturing positions are calculated by converting the $2^t$ linear combinations to decimal numbers.

5. The method as claimed in claim 3, wherein the 2 puncturing positions are calculated by applying the $2^t$ linear combinations to an equation given below:

$$P_i = \sum_{j=0}^{k-1} c_j^i 2^t \quad t = 1, \ldots, 2^t.$$

6. The method as claimed in claim 1, wherein the $2^k$ first order Reed-Muller codes are codes for encoding the k input information bits.

7. The method as claimed in claim 1, wherein the $2^k$ first order Reed-Muller codes are a coded symbol stream obtained by encoding the k input information bits with a given code.

8. A method for generating ($2^k-2^t$) first order Reed-Muller codes from $2^k$ first order Reed-Muller codes based on k input information bits, for encoding said k input information bits in an encoder, comprising the steps of:
   selecting t linearly independent $k^{th}$ order vectors;
   generating $2^t$ linear combinations by linearly combining the t selected vectors;
   calculating $2^t$ puncturing positions corresponding to the $2^t$ linear combinations;
   selecting one k×k matrix out of a plurality of k×k matrixes having k×k inverse matrixes;
   calculating $2^t$ new puncturing positions by multiplying each of the $2^t$ puncturing positions by the selected k×k matrix;
   generating ($2^k-2^t$) first order Reed-Muller codes by puncturing the $2^t$ new puncturing positions from the $2^k$ first order Reed-Muller codes; and
   encoding said k input information bits using said ($2^k-2^t$) first order Reed-Muller codes.

9. The method as claimed in claim 8, wherein the linearly independent $k^{th}$ order vectors satisfy a linear independent property represented by, $$v^0, v^1, \ldots, v^{t-1}: \text{linear independent property} \Leftrightarrow$$
$$c_{t-1}v^{t-1}+\ldots+c_1v^1+c_0v^0 \neq 0, \forall c_0, c_1, \ldots, c_{t-1}.$$

10. The method as claimed in claim 8, wherein the $2^t$ linear combinations are, $$c^i=(c_{k-1}^i, \ldots, c_1^i, c_0^i)$$

where i indicates an index for the number of the linear combinations.

11. The method as claimed in claim 10, wherein the $2^t$ puncturing positions are calculated by converting the $2^t$ linear combinations to decimal numbers.

12. The method as claimed in claim 8, wherein the $2^t$ puncturing positions are calculated by applying the $2^t$ linear combinations to an equation given below:

$$P_i = \sum_{j=0}^{k-1} c_j^i 2^t \quad t = 1, \ldots, 2^t.$$

13. The method as claimed in claim 8, wherein the $2^k$ first order Reed-Muller codes are codes for encoding the k input information bits.

14. The method as claimed in claim 8, wherein the $2^k$ first order Reed-Muller codes are a coded symbol stream obtained by encoding the k input information bits with a given code.

15. The method as claimed in claim 8, wherein the selected k×k matrix A is given as follows:

$$A = \begin{bmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{bmatrix}.$$

16. An apparatus for encoding k input information bits in a transmitter for a CDMA (Code Division Multiple Access) mobile communication system, comprising:
   an encoder for encoding the k input information bits with $2^k$-bit first order Reed-Muller codes, and outputting $2^k$ coded symbols; and a puncturer for puncturing the coded symbols in puncturing positions corresponding to at least $2^t$ linear combinations, obtained from t linearly independent $k^{th}$ order vectors, from the $2^k$ coded symbols, and outputting $(2^k-2^t)$ coded symbols.

17. The apparatus as claimed in claim 16, wherein the linearly independent $k^{th}$ order vectors satisfy a linear independent property represented by, $v^0, v^1, \ldots, v^{t-1}$: linear independent property $\Leftrightarrow$
$c_{t-1}v^{t-1}+\ldots+c_1v^1+c_0v^0 \neq 0, \forall c_0, c_1, \ldots, c_{t-1}$.

18. The apparatus as claimed in claim 16, wherein the $2^t$ linear combinations are, $c^i=(c_{k-1}{}^i, \ldots, c_1{}^i, c_0{}^i)$ where i indicates an index for the number of the linear combinations.

19. The apparatus as claimed in claim 16, wherein the $2^t$ puncturing positions are calculated by converting the $2^t$ linear combinations to decimal numbers.

20. The apparatus as claimed in claim 18, wherein the $2^t$ puncturing positions are calculated by applying the $2^t$ linear combinations to an equation given below:

$$P_i = \sum_{j=0}^{k-1} c_j^i 2^t \quad t=1, \ldots, 2^t.$$

21. An apparatus for encoding k input information bits in a transmitter for a CDMA mobile communication system, comprising:
  a code generator for puncturing $2^t$ number of bits, which are positioned in corresponding linear combinations of t linearly independent $k^{th}$ order vectors, from $2^k$-bit first order Reed-Muller code bits, and outputting $(2^k-2^t)$-bit first order Reed-Muller codes; and
  an encoder for encoding the k input information bits with the $(2^k-2^t)$-bit first order Reed-Muller codes, and outputting $(2^k-2^t)$ coded symbols.

22. The apparatus as claimed in claim 21, wherein the linearly independent $k^{th}$ order vectors satisfy a linear independent property represented by, $v^0, v^1, \ldots, v^{t-1}$: linear independent property $\Leftrightarrow$
$c_{t-1}v^{t-1}+\ldots+c_1v^1+c_0v^0 \neq 0, \forall c_0, c_1, \ldots, c_{t-1}$.

23. The apparatus as claimed in claim 21, wherein the $2^t$ linear combinations are, $c^i=(c_{k-1}{}^i, \ldots, c_1{}^i, c_0{}^i)$ where i indicates an index for the number of the linear combinations.

24. The apparatus as claimed in claim 21, wherein the $2^t$ puncturing positions are calculated by converting the $2^t$ linear combinations to decimal numbers.

25. The apparatus as claimed in claim 23, wherein the $2^t$ puncturing positions are calculated by applying the $2^t$ linear combinations to an equation given below:

$$P_i = \sum_{j=0}^{k-1} c_j^i 2^t \quad t=1, \ldots, 2^t.$$

26. The apparatus as claimed in claim 21, wherein the encoder comprises:
  k multipliers each for multiplying one input information bit out of the k input information bits by one $(2^k-2^t)$-bit first order Reed-Muller code out of the $(2^k-2^t)$-bit first order Reed-Muller codes, and outputting a coded symbols stream comprised of $(2^k-2^t)$ coded symbols; and
  a summer for summing up the coded symbol streams output from each of the k multipliers in a symbol unit, and outputting one coded symbol stream comprised of $(2^k-2^t)$ coded symbols.

27. A method for receiving $(2^k-2^t)$ coded symbols from a transmitter and decoding k information bits from the $(2^k-2^t)$ received coded symbols, comprising the steps of:
  selecting t linearly independent $k^{th}$ order vectors, and calculating positions corresponding to $2^t$ linear combinations obtained by combining the t selected vectors;
  outputting $2^k$ coded symbols by inserting zero (0) bits in the calculated positions of the $(2^k-2^t)$ coded symbols;
  calculating reliabilities of respective first order Reed-Muller codes comprised of the $2^k$ coded symbols and $2^k$ bits used by the transmitter; and
  decoding the k information bits from the $2^k$ coded symbols with a first order Reed-Muller code having the highest reliability.

28. The method as claimed in claim 27, wherein the linearly independent $k^{th}$ order vectors satisfy a linear independent property represented by, $v^0, v^1, \ldots, v^{t-1}$: linear independent property $\Leftrightarrow$
$c_{t-1}v^{t-1}+\ldots+c_1v^1+c_0v^0 \neq 0, \forall c_0, c_1, \ldots, c_{t-1}$.

29. The method as claimed in claim 27, wherein the $2^t$ linear combinations are, $c^i=(c_{k-1}{}^i, \ldots, c_1{}^i, c_0{}^i)$ where i indicates an index for the number of the linear combinations.

30. The method as claimed in claim 27, wherein the $2^t$ puncturing positions are calculated by converting the $2^t$ linear combinations to decimal numbers.

31. The method as claimed in claim 29, wherein the $2^t$ puncturing positions are calculated by applying the $2^t$ linear combinations to an equation given below:

$$P_i = \sum_{j=0}^{k-1} c_j^i 2^t \quad t=1, \ldots, 2^t.$$

32. An apparatus for receiving $(2^k-2^t)$ coded symbols from a transmitter and decoding k information bits from the $(2^k-2^t)$ received coded symbols, comprising:
  an inserter for selecting t linearly independent $k^{th}$ order vectors, calculating positions corresponding to $2^t$ linear combinations obtained by combining the t selected vectors, and outputting $2^k$ coded symbols by inserting predetermined bits in the calculated positions of the $(2^k-2^t)$ coded symbols;
  an inverse fast Hadamard transform part for calculating reliabilities of respective first order Reed-Muller codes comprised of the $2^k$ coded symbols and $2^k$ bits used by the transmitter, and decoding the k information bits from the $2^k$ coded symbols with the first order Reed-Muller codes corresponding to the respective reliabilities; and
  a comparator for receiving in pairs the reliabilities and the information bits from the inverse fast Hadamard transform part, comparing the reliabilities, and outputting information bits pairing with the highest reliability.

* * * * *